United States Patent [19]
Pettit

[11] 3,978,400
[45] Aug. 31, 1976

[54] GROUND FAULT DETECTOR WITH A NONLINEAR SENSING MEANS

[75] Inventor: Dorn L. Pettit, Wauwatosa, Wis.

[73] Assignee: Square D Company, Park Ridge, Ill.

[22] Filed: Nov. 25, 1974

[21] Appl. No.: 526,568

[52] U.S. Cl................................ 324/51; 317/18 D; 340/255
[51] Int. Cl.² ..................... G01R 31/02; H02H 3/16
[58] Field of Search ................. 324/51, 132; 317/16, 317/18 D, 18 B; 340/255, 253 R

[56] References Cited
UNITED STATES PATENTS

| | | | |
|---|---|---|---|
| 3,165,671 | 1/1965 | Mintz et al................. | 317/18 D UX |
| 3,187,225 | 6/1965 | Mayer........................ | 317/18 D UX |
| 3,259,802 | 7/1966 | Steen ................... | 317/18 D |
| 3,268,813 | 8/1966 | Pendleton ............... | 324/132 |
| 3,356,939 | 12/1967 | Stevenson ................ | 324/51 |
| 3,419,756 | 12/1968 | Philibert et al. ........... | 317/16 |
| 3,506,906 | 4/1970 | Nestor ................. | 317/18 D |
| 3,535,590 | 10/1970 | Mayer................... | 317/18 D |
| 3,555,360 | 1/1971 | Lee et al................ | 317/18 D |
| 3,571,660 | 3/1971 | Phillips .................. | 317/16 |

Primary Examiner—Gerard R. Strecker
Attorney, Agent, or Firm—James S. Pristelski; Harold J. Rathbun; William H. Schmeling

[57] ABSTRACT

A ground fault detector for an ungrounded electrical distribution system responds to a wide range of ground fault current levels by providing the ground fault sensing circuitry with a high impedance at low ground fault signal levels and a low impedance at higher ground fault signal levels. The varying or nonlinear impedance of the sensing circuitry occurs due to the presence of the series combination of a Zener diode and a resistor connected in parallel with a level sensing means. At ground fault signals below the Zener voltage of the Zener diode, the impedance of the sensing circuitry is that of the level sensing means. When the ground fault signal exceeds the Zener voltage, the impedance of the sensing means is significantly reduced since the Zener resistor is now in effective parallel combination with the impedance of the level sensing means.

Varying degrees of filtering of the ground fault signal are accomplished through provision of alternate connection terminals of increasing resistance for a filtering capacitor.

A ground fault test circuit for the detector provides the equivalent of one-half ampere ground fault. Higher ground faults may easily be simulated by winding additional turns of a test winding on a differential transformer of the detector; each additional turn simulates an additional one-half ampere ground fault.

3 Claims, 2 Drawing Figures

GROUND FAULT DETECTOR WITH A NONLINEAR SENSING MEANS

BACKGROUND OF THE INVENTION

This invention relates to ground fault detectors for electrical distribution systems, and more particularly to ground fault detectors which respond to a wide range of ground fault current levels from ungrounded electrical distribution systems.

Paragraph 503–13 of the National Electrical Code 1975 requires a ground fault detector or indicator which provides an audio and visual alarm whenever a ground fault from an ungrounded electrical power distribution system occurs and persists. Ungrounded distribution systems are preferred and frequently used in the textile industry and in other production-line industries since a ground fault is not fatal to the operation of an ungrounded distribution system as long as two or more ground faults are not simultaneously present. Also, repair of any component or device in the power system can be effected without shutting down the distribution system and consequently the production line.

The problem with designing ground fault detectors for textile mills or production lines is that a wide variety of equipment and electrical distribution apparatus is encountered and varying degrees of ground fault protection are desirable. Accordingly, a major object of this invention is to provide a single ground fault detector which is responsive to a wide range of ground fault current levels.

Another problem of providing ground fault protection for industrial environments is to prevent or minimize false ground fault detection due to the presence of high electrical noise levels. To this end, another object of the invention is to provide varying degrees of filtering of potential ground fault signals to prevent the generation of false ground fault alarms due to electrical noise.

Other objects and advantages of the invention will become apparent as the description of the invention proceeds.

SUMMARY OF THE INVENTION

A ground fault detector for signalling the presence of ground fault currents from an ungrounded electrical distribution system utilizes a differential transformer to sense an unbalance of current in the electrical conductors of the distribution system. The electrical conductors pass through the window area of a core of the differential transformer and a secondary sense winding on the core provides an electrical signal indicative of the magnitude of a ground fault whenever the summation of currents in the electrical conductors is non-zero. The electrical signal from the sense winding is rectified and applied to a voltage level sensing circuit. In parallel with the level sensing circuit is the series combination of a Zener diode and a resistor. The Zener diode and resistor provide variable loading on the differential transformer depending upon whether the rectified electrical signal exceeds or is less than the Zener voltage of the Zener diode. Since the impedance of a Zener diode is high when the voltage applied to it is less than its Zener voltage and the impedance is quite small when the Zener voltage is exceeded, the Zener diode and resistor connected in parallel with the voltage level sensing circuit provide a high impedance to the differential transformer at low sense winding signal levels. Conversely, at higher sense winding signal levels, the Zener diode and its series resistor provide a reduced impedance level when the Zener voltage is exceeded and, hence, a higher current load to the differential transformer. This variation in loading at different sense winding signal levels effectively provides a wide range of adjustment for the threshold of the voltage level sensing circuit as well as increased sensitivity to lower level sense winding signals when the ground fault detector is adjusted to detect higher level sense winding signals. To further broaden the adjustability threshold range, the level sensing circuit is provided with a variable resistor to vary the input impedance of that circuit.

A capacitor, generally in parallel with the rectifier, filters the rectified signal and may be connected to one of a plurality of varying resistive terminals to provide various degrees of immunity to electrically noisy environments.

BRIEF DESCRIPTION OF THE DRAWINGS

The invention may be best understood by reference to the following description taken in conjunction with the accompanying drawings in which.

DESCRIPTION OF THE PREFERRED EMBODIMENT

Figure 1:
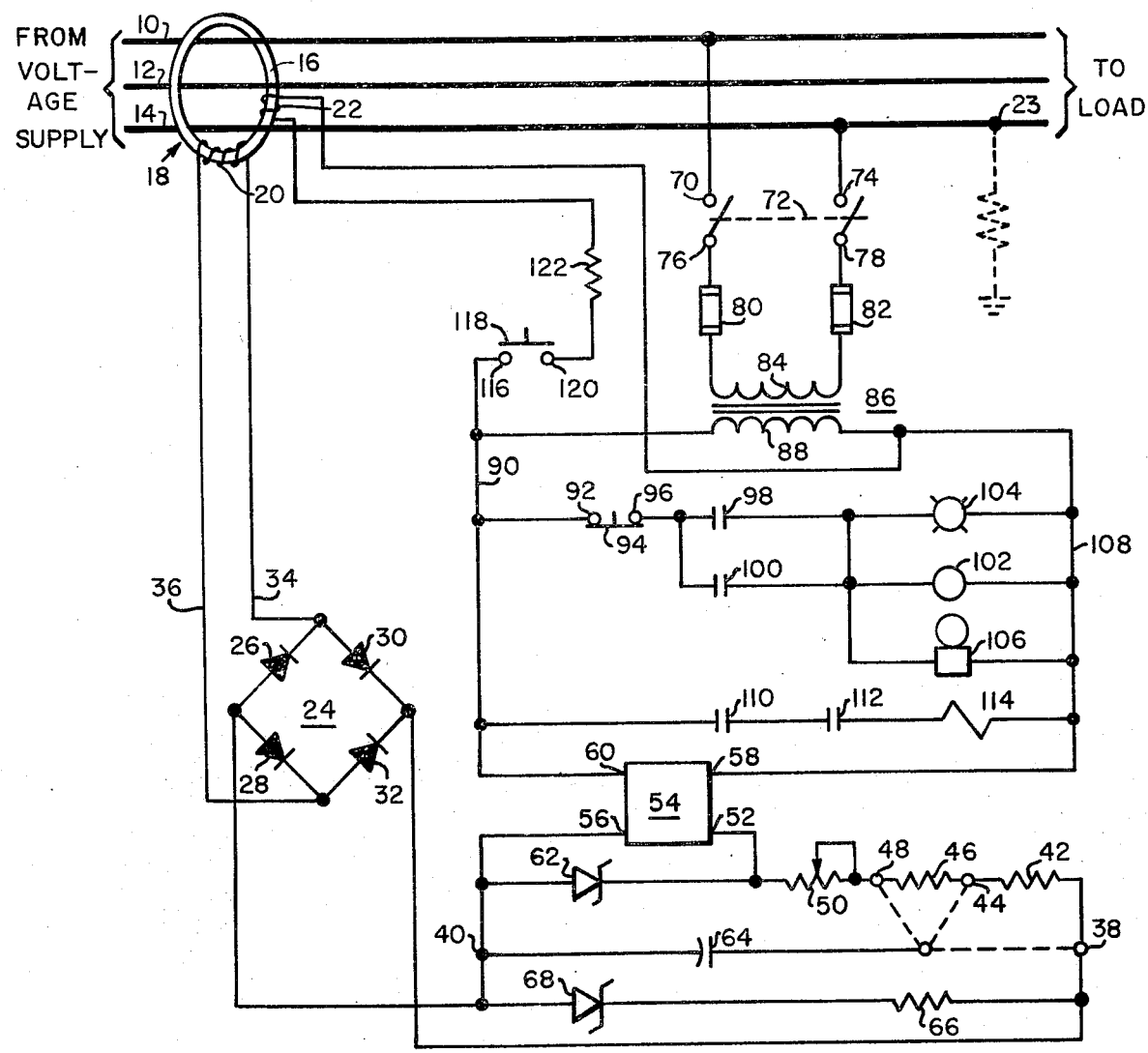
FIG. 1 is a schematic electrical wiring diagram illustrating the ground fault detector in the invention.

Referring now to FIG. 1, there is shown one embodiment of a ground fault detector which is utilized in conjunction with an ungrounded electrical distribution system to satisfy the requirements of Paragraph 503–13 of the National Electrical Code 1975.

Illustrated in FIG. 1 is a three-phase ungrounded distribution system including electrical conductors 10, 12 and 14 which connect a load (not shown) to a three-phase voltage source (not shown). It will be appreciated that the invention can also be adapted to a conventional two-conductor ungrounded single-phase distribution system.

Typically, the conductors 10, 12 and 14 pass through the window area of a toroidal core 16 of a differential transformer 18 thereby providing the equivalent of a one turn winding on the differential transformer. The differential transformer 18 is further provided with a ground fault sense winding 20 consisting of a plurality of turns on the core 16. A test winding 22 consisting of from one to several turns on the core 16 is also provided.

Under normal operating conditions, the net summation of the currents in the conductors 10, 12 and 14 is zero. Thus the magnetic fields induced into the core 16 by the currents in the conductors 10, 12 and 14 oppose and cancel each other leaving no net magnetic field in the core 16 of the differential transformer 18. The lack of a net magnetic field in the core 16 induces no current into the ground fault sense winding 20.

However, when a ground fault from one of the ungrounded conductors 10, 12 and 14 to ground occurs, as at 23, the current through the ground fault by-passes the toroidal core 16 in its return path to the voltage source. The summation of conductor currents by the differential transformer 18 is then non-zero and a magnetic field is established in the core 16. A current is simultaneously induced into the sense winding 20, which behaves as a secondary winding on the differential transformer 18. It will be appreciated that the magnitude of the ground fault current is directly related to the amount of current imbalance in the conductors 10, 12 and 14 and hence, to the strength of the magnetic field in the core 16 and to the current induced into the sense winding 20.

The test winding 22 is utilized to purposely induce a magnetic field into the core 16 which is related in strength to the minimum level of ground fault current which is desired to be detected. The test winding 22 is energized at periodic intervals, that is, whenever testing of the ground fault detector is desired.

Turning back to the mode of detecting a ground fault, it will be appreciated that since the voltage source is alternating current (A.C.) in nature, the electrical signal induced into the sense winding 20, during the presence of a ground fault, will also be A.C. in nature. To convert this A.C. signal to a direct current (D.C.) voltage for the sensing circuitry, to be later described, there is provided a full-wave rectifying bridge 24 comprising diodes 26, 28, 30 and 32. One end of the sense winding 20 is connected to the anode of the diode 30 and to the cathode of the diode 26 via a lead 34, with the other end of the sense winding 20 connected to the opposite side of the diode bridge 24, comprising the anode of the diode 32 and the cathode of the diode 28 via a lead 36. The positive polarity of the rectified D.C. voltage appears at the junction 38 which is connected to the cathodes of the diodes 30 and 32, with the negative polarity appearing at the junction 40 which is connected to the anodes of the diodes 26 and 28.

The level sensing means or circuitry which is connected from the junction 38 to the junction 40, comprises a resistor 42 connected from the junction 38 to a junction 44, a resistor 46 connected from the junction 44 to a junction 48, a variable resistor 50 connected from the junction 48 to a terminal 52 of a solid state relay 54. Another sensing terminal 56 of the solid state relay 54 is connected to the junction 40. Two other terminals 58, 60 of the solid state relay 54 are connected across a 120 volt A.C. voltage supply to energize a coil (not shown) of the solid state relay 54 whenever the threshold voltage level of the level sensing means is exceeded.

A solid state relay 54 which may be utilized in practicing the invention is commercially available from the Square D Company, Park Ridge, Illinois, and is designated as Class 8501, Type TS. This solid state relay 54 will energize an associated coil when the voltage applied to terminal 52 is approximately two volts positive with respect to the terminal 56. The input impedance into terminal 52 is approximately six kilo-ohms whenever the voltage applied across the terminals 52, 56 is below the two volt threshold.

The variable resistor 50 is selected to provide a broad range of adjustment of the resistive impedance of the level sensing means. Since the combined resistance of the resistors 42, 46 and 50 can be adjusted to vary over a wide range as compared to the fixed input impedance of the solid state relay 54 between the terminals 52, 56, the level sensing means comprising the solid state relay 54 and the resistors 42, 46 and 50 can be made to be responsive to a range of rectified voltage levels across the junctions 38, 40. Since the rectified voltage is directly related to the magnitude of the ground fault, it can be appreciated that the adjustment of the variable resistor 50 makes the level sensing means responsive to various ground fault magnitudes.

The Zener diode 62 is selected to protect the terminals 52, 56 of the solid state relay 54 from the application of excessive voltage. Therefore its Zener voltage is somewhat greater than the threshold level of the solid state relay 54 and the Zener diode 62 does not affect ordinary operative modes of the ground fault detector.

A capacitor 64 is provided to filter the rectified D.C. voltage. The negative terminal of the capacitor 64 is connected to the junction 40. The positive terminal of the capacitor 64 is provided with three alternate terminals 38, 44, 48 to allow varying degrees of filtering of the rectified D.C. voltage. The positive terminal of the capacitor 64 is ordinarily connected to the junction 38, but if higher immunity to electrical noise is desired, the capacitor 64 may be connected to either of the junctions 44, 48.

According to the invention, a resistor 66 and a Zener diode 68 are connected in series across the junctions 38, 40. The Zener diode 68 is poled such that the cathode of the Zener diode 68 is connected through the resistor 66 to the junction 38 and the anode is connected to the junction 40.

Figure 2:
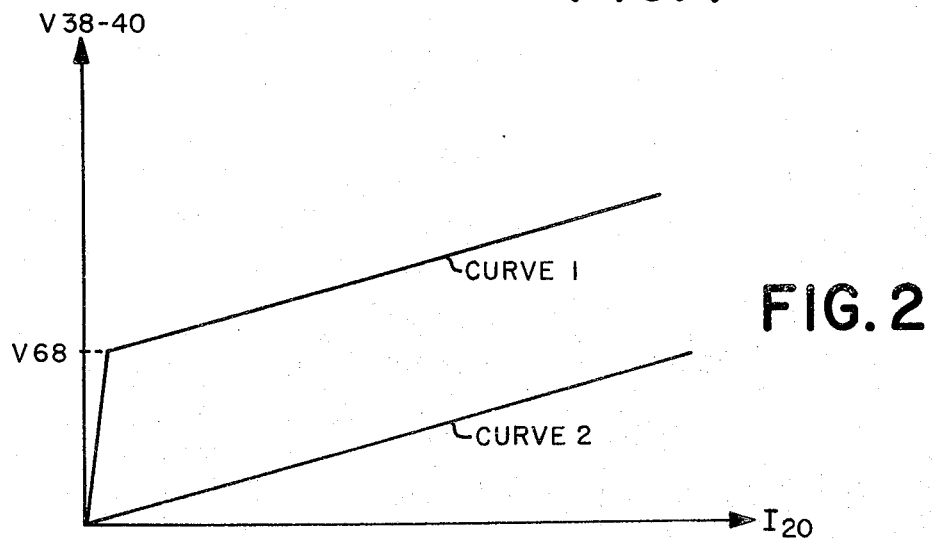
FIG. 2 is a graph which illustrates how the invention alters the rectified sense voltage and sense winding current characteristic from that of a basically resistive load on the sense winding.

As can be appreciated from an examination of Curve 1 in the graph of FIG. 2, below the Zener voltage, V68 of the Zener diode 68, the only resistive loading to the rectified D.C. voltage V38–40, and hence to the current I20 of the sense winding 20 of the differential transformer 18 is the resistive impedance of the level sensing means comprising the resistors 42, 46 and 50 and the input impedance of the solid state relay 54. When the rectified D.C. voltage V38–40 across the junctions 38, 40 exceeds the Zener voltage V68 of the Zener diode 68, the resistance of the resistor 66 is in parallel with the resistive impedance of the level sensing means.

Thus, the effective resistance presented to the sense winding 20 is high at lower ground fault levels. Conversely, the effective resistance presented to the sense winding 20 is low at higher ground fault levels. The major advantage of a high resistance at lower ground fault levels and a low resistance at higher ground fault levels is that the level sensing means is made more responsive to the lower ground fault levels. That is, the varying resistance of the sensing circuitry comprising the level sensing means and Zener-resistor combination with varying magnitudes of ground fault signals causes the rectified D.C. voltage V38–40 applied to the level sensing means to be higher at low ground fault signal levels than for a fixed resistance type of level sensing circuitry which would have a linearly increasing rectified D.C. voltage with increasing ground fault levels. The non-linear approach of the invention enables the ground fault detector to respond to a broader range of ground fault levels. For example, if a 5 ampere ground fault detector is required, a fixed resistor level sensing means will only have one-fifth as mch rectified D.C. voltage applied to the level sensing means if the actual ground fault is one ampere. However, an inspection of Curve 1 of FIG. 2 demonstrates that the non-linear approach of the invention could easily result in the rectified D.C. voltage V38–40 applied to the level sensing means at a one ampere ground fault to be 75 per cent or more of the voltage V38–40 generated by a 5 ampere ground fault. Thus, the range of ground fault current levels to which the non-linear level sensing means is responsive is significantly increased as represented in Curve 1 of FIG. 2, as compared to a fixed resistance and, hence, linear level sensing means as represented in Curve 2.

Another advantage of the non-linear approach occurs when a broad range of ground faults are to be detected. For example, if the detector must respond to ground faults in the one to 5 ampere range, the fixed resistance linear approach would place five times as much voltage on the level sensing means at a 5 ampere ground fault as compared to the one ampere fault. However, using the non-linear approach of the invention, only one-third as much rectified D.C. voltage $V_{38-40}$ might be applied to the level sensing means at a 5 ampere fault as compared to a one ampere fault. Thus, over-voltage protection for the level sensing means may not be necessary in the non-linear approach or, if necessary, such protection will not have to protect against high multiples of rectified D.C. voltage $V_{38-40}$.

Looking at other undiscussed portions of the ground fault detector schematic of FIG. 1, one pole 70 of a single-throw, double-pole switch 72 is connected to one phase of the three phase distribution system while the other pole 74 is connected to a different phase. The switched poles 76, 78 of the switch 72 are each connected through a fuse 80 and 82, respectively, to opposite ends of a primary winding 84 of a transformer 86. The secondary winding 88 of the transformer 86 provides a 120 volt A.C. voltage supply for industrial-type control circuitry.

One lead 90 of the 120V A.C. supply is connected to a contact 92 of a normally-closed reset pushbutton 94. The other contact 96 of the pushbutton 94 is connected to a normally-open contact 98 of the solid state relay 54 and to a normally open contact 100 of a control relay 102. The contacts 98, 100 are in turn connected to a ground fault warning light 104, to the control relay 102 and to a ground fault warning bell 106 or other audible warning device. The light 104, relay 102 and bell 106 are in turn connected to the other 120V A.C. lead 108.

Thus, whenever the threshold level of the solid state relay 54 is exceeded because of a ground fault of sufficient magnitude, the normally open contact 98 of the solid state relay 54 closes. Since the reset pushbutton 94 is normally closed, the warning light 104 is immediately illuminated providing a visual warning that a ground fault is present, the control relay 102 is energized and the bell 106 provides an audible warning that a ground fault is present. However, when the control relay 102 is energized, the normally open contact 100 closes and the control relay 102 latches, thereby memorizing that a ground fault occurred. Even if the ground fault terminates, the control relay 102 remains energized and its contact 100 remains closed. Thus the light 104 and the bell 106 continue to warn of the prior ground fault until the reset pushbutton 94 is depressed thereby causing the pushbutton 94 to assume an open state, deenergizing the control relay 102 and opening the previously latched contact 100.

Connected to the lead 90 of the 120V A.C. supply is another normally-open control contact 110 of the relay 102. The contact 110 is in turn connected to a normally-open coil clearing contact 112 which is in turn connected to the energizing coil 114 of a circuit breaker (not shown) which interrupts the three phase voltage supply upon the occurrence of a ground fault. The contact 112 is closed when the circuit breaker is reset to close the three phase supply circuit. Thus, the ungrounded three phase power supply is not interrupted when a ground fault occurs, but only the device or machinery which caused or was associated with the ground fault.

To one lead 90 of the 120V A.C. supply is connected a contact 116 of a normally open test pushbutton 118. The other contact 120 of the pushbutton 110 is connected to a resistor 122 which is connected to the other lead 108 of the 120V A.C. supply through the test winding 22. The resistance of the resistor 122 is selected such that one-half ampere of current passes through the test winding 22 whenever the test pushbutton 118 is closed. When the resistor 122 is so selected, the number of turns in the test winding 22 may be programmed to simulate the ground fault current level by one-half ampere increments to which the detector is desired to respond. As an example, if test winding 22 is a single turn, the equivalent of one-half ampere ground fault is simulated. Similarly, if the test winding 22 is four turns, a two ampere ground fault is simulated. Thus, by simulating the desired ground fault sensitivity by programming the number of turns on the test winding 22 and by adjusting the variable resistor 50 to set the threshold of the level detecting means at the corresponding rectified D.C. voltage $V_{38-40}$ between the leads 38, 40, the ground fault detector is easily adaptible to a range of ground fault requirements.

While a preferred embodiment of the invention has been shown and described in detail, it will be apparent to those skilled in the art that various changes and modifications may be made herein without departing from the spirit and scope of the invention.

I claim:

1. A ground fault detector for sensing ground faults in an electrical distribution system having at least two conductors of the type wherein the electrical distribution system is ungrounded comprising:

a differential current transformer positioned to sense the non-zero summation of currents in the conductors of the system, a secondary winding on the transformer and a rectifying means providing a direct current signal indicative of the magnitude of the non-zero summation of the currents of the system, a sensing circuit responsive to the direct current signal to produce an output, a switching means responsive to the sensing circuit output whenever the sensing circuit output exceeds a selected fraction of the magnitude of the direct current signal, a means for varying impedance of the sensing circuit and thereby the value of said selected fraction of the direct current signal so that the selected fraction is greater when the magnitude of the direct current signal is less than the predetermined level and less when the magnitude is greater than the predetermined level.

2. The ground fault detector as in claim 1 wherein the means for varying the impedance comprises a series combination of a Zener diode and a resistor with the combination connected in parallel with the sensing circuit to produce a lower input impedance for the sensing circuit when the direct current signal exceeds the Zener voltage of the Zener diode thereby providing increased loading at higher direct current levels and decreased loading at lower direct current levels.

3. The ground fault detector as in claim 2 also comprising a capacitor connected in parallel with the sensing circuit and with selectable connection terminals of varying resistance to provide varying degrees of filtering of the direct current signal.

* * * * *